US005841194A

United States Patent [19]

Tsukamoto

[11] Patent Number: 5,841,194

[45] Date of Patent: Nov. 24, 1998

[54] CHIP CARRIER WITH PERIPHERAL STIFFENER AND SEMICONDUCTOR DEVICE USING THE SAME

[75] Inventor: Masahide Tsukamoto, Nara, Japan

[73] Assignee: Matsushita Electric Industrial Co., Ltd., Osaka, Japan

[21] Appl. No.: 814,984

[22] Filed: Mar. 14, 1997

[30] Foreign Application Priority Data

Mar. 19, 1996 [JP] Japan .................................... 8-063405

[51] Int. Cl.[6] ..................................................... H01L 23/06

[52] U.S. Cl. ........................... 257/729; 257/702; 257/668

[58] Field of Search .................................... 257/668, 701, 257/703, 729, 702, 678, 679

[56] References Cited

U.S. PATENT DOCUMENTS

| | | | |
|---|---|---|---|
| 4,318,954 | 3/1982 | Jensen | 428/209 |
| 5,067,004 | 11/1991 | Marshall et al. | 257/668 |
| 5,067,008 | 11/1991 | Yanaka et al. | 257/703 |
| 5,483,421 | 1/1996 | Gedney et al. | 361/771 |
| 5,661,086 | 8/1997 | Nakashima et al. | 257/668 |
| 5,702,985 | 12/1997 | Burns | 257/703 |

FOREIGN PATENT DOCUMENTS

| | | |
|---|---|---|
| 5-13603 | 1/1993 | Japan . |
| 7-283337 | 10/1995 | Japan . |

OTHER PUBLICATIONS

Array Packaging, Opportunities and Implications for the Electronics Industry, BPA, Report No. 492, Mar. 1993.

*Primary Examiner*—Olik Chaudhuri
*Assistant Examiner*—Nathan K. Kelley
*Attorney, Agent, or Firm*—Merchant, Gould, Smith, Edell, Welter & Schmidt, P.A.

[57] ABSTRACT

A carrier substrate comprises a flexible insulating substrate containing aramid fiber as a reinforcer, first bonding pads formed on one side of the flexible insulating substrate, and second bonding pads formed on the other side of the flexible insulating substrate, where the first bonding pads and the second bonding pads are electrically bonded by via-holes punched in the flexible insulating substrate. The carrier substrate and a peripheral stiffener made of a material whose thermal expansion coefficient is higher than that of the carrier substrate compose a chip carrier, and an LSI chip is mounted on the recess of the chip carrier.

19 Claims, 6 Drawing Sheets

106
107 104 103 105 102 101
108

102 106
101 107

201 202 203 204 206 205 106
107 104 103 105 102 101
108

F/G. 3

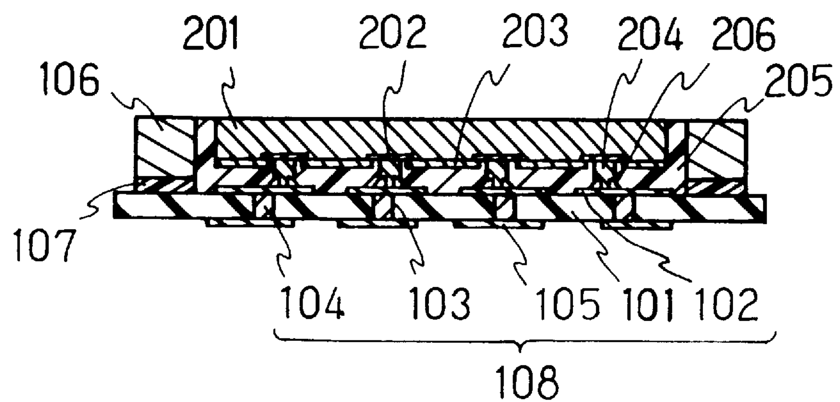
F/G. 6
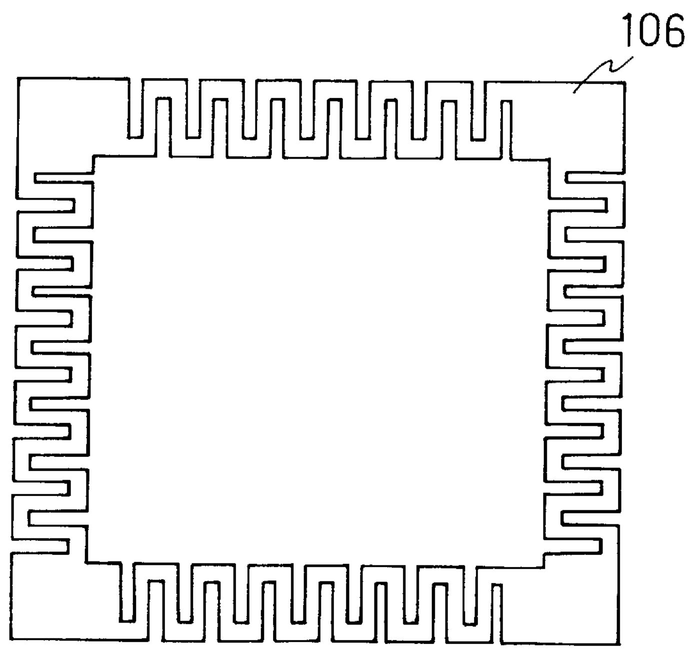
F/G. 7

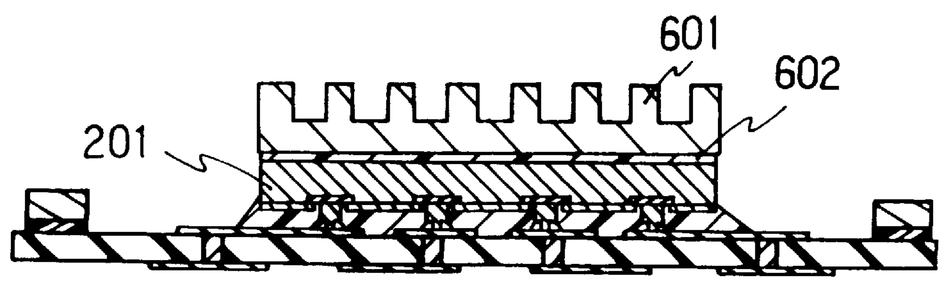
F/G. 8
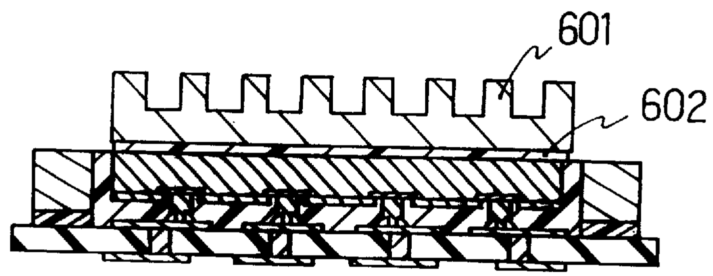
F/G. 9

CHIP CARRIER WITH PERIPHERAL STIFFENER AND SEMICONDUCTOR DEVICE USING THE SAME

FIELD OF THE INVENTION

This invention relates to a semiconductor device, more specifically, this invention relates to a carrier substrate which is used for packaging a semiconductor chip (LSI chip), and a semiconductor device having a carrier substrate equipped with the semiconductor chip.

BACKGROUND OF THE INVENTION

The semiconductor package generally used at present is a plastic quad flat package (QFP) where input-output leads are pulled out from four sides of the package. As electronic devices in various fields have various functions and their performance is improved, LSIs are becoming larger. Therefore, the input-output terminals of a plastic QFP increase and the QFP package becomes larger. In order to prevent the package size from being too large, the design rule of a semiconductor chip is finely decided and its lead pitch is made narrow, so that the package is applicable to the trend of miniaturization of various electronic devices.

However, an LSI having more than 400 pins is difficult to solder efficiently. Moreover, it is impossible to make the lead pitch extremely narrow. Therefore, such a large-scaled LSI cannot be fully miniaturized.

In addition, the difference between the thermal expansion coefficients of a semiconductor package and a mother printed circuit board causes problems when the semiconductor package is mounted on the mother circuit board. It is extremely difficult to accurately bond many thin input-output leads of the semiconductor package and many fine electrode terminals on the printed circuit board.

Moreover, a plastic QFP of a semiconductor package having many pins becomes larger and the lead pins also become longer. As a result, signal transmission will be delayed and the signal cannot be processed with high-speed.

In order to solve these and other problems concerning the plastic QFP, a ball grid array (BGA) and a land grid array (LGA) are currently proposed in place of the QFP. A BGA has spherical bonding terminals on the backside of a semiconductor package arrayed two-dimensionally. An LGA has many flat electrode pads arranged on the backside of a semiconductor package.

These BGA and LGA are classified into CBGA (ceramic ball grid array), PBGA (plastic ball grid array), TBGA (tape ball grid array), and TLGA (tape land grid array), depending on their carrier substrate materials. A PBGA is comparatively cheap and it is widely used. In PBGA, a resin substrate (e.g. glass epoxy substrate) reinforced with glass fiber is used for the carrier substrate. A TBGA or TLGA is prepared by adhering a peripheral stiffener around one face of a double-sided flexible carrier substrate having through holes, and mounting and molding a semiconductor chip on a recess which is formed on the carrier substrate surrounded with the peripheral stiffener. The TBGA is provided with solder balls etc. on the other face of the carrier substrate, while the TLGA does not have such solder balls.

However, ceramics used for the carrier substrate of CBGA are expensive. Moreover, it is difficult to have a reliable bonding in the CBGA, since the ceramic carrier substrate has a thermal expansion coefficient that is much lower than that of the glass epoxy (the mother board). Namely, disconnection occurs due to the difference of the thermal expansion coefficients. A problem of the PBGA is that the yield deteriorates when manufacturing the carrier substrate and packaging it into the mother board, since glass fibers contained in the substrate increase warping and strain of the substrate. Although expensive double-sided flexible substrates are used for carrier substrates of packaging such as TBGA and TLGA, the flexibility prevents the substrate from being flat, and thus, it is difficult to manufacture such substrates with good yield.

As a result, conventional BGA and LGA are expensive. In addition to that, the great gap between the thermal expansion coefficients of the flexible substrate and the semiconductor chip causes bad bonding reliability when the semiconductor chip is bonded to the carrier substrate and when the bonded carrier substrate is mounted on the glass epoxy mother board.

In order to solve such problems, this invention aims to provide a chip carrier having excellent bonding reliability and a semiconductor device using the same. Excellent bonding reliability indicates that rupture or disconnection does not occur if the thermal expansion coefficients are different between the LSI chip and the chip carrier, or between the chip carrier and the mother board in a semiconductor device which is easily produced and used for various electronic devices.

SUMMARY OF THE INVENTION

In order to achieve the above-mentioned aims, a chip carrier of this invention comprises a carrier substrate and a peripheral stiffener provided at the periphery of the carrier substrate. The peripheral stiffener is made of a material having a thermal expansion coefficient higher than that of the carrier substrate. The carrier substrate comprises a flexible insulating substrate containing aramid fiber as a reinforcer, first bonding pads formed on one face of the flexible insulating substrate and second bonding pads formed on the other face of the flexible insulating substrate. The first bonding pads and the second bonding pads are electrically bonded with each other by via-holes punched in the flexible insulating substrate. Using a chip carrier of this invention, the carrier substrate is maintained flat without deformation even if the carrier substrate is left at high temperatures during packaging or testing, since the stiffener provides the carrier substrate with tension. As a result, the yield is improved when packaging. The thermal expansion coefficient of a conventional flexible substrate using polyimide film is quite different from that of a silicon semiconductor chip. On the other hand, the carrier substrate containing aramid fiber as a reinforcer has a thermal expansion coefficient that is not so different from that of a silicon semiconductor chip. Therefore, the carrier substrate of this invention is substantially not ruptured due to heat cycles etc. during reliability test. Furthermore, the thermal expansion coefficient of the carrier substrate is lower than that of the mother board comprising glass epoxy, and the carrier substrate is more flexible than the mother board, so soldering bonding is well conducted. In other words, stress on the solder-connected portions is reduced because the resin of the carrier substrate and of the mother board is softened at higher temperatures. At lower temperatures, the mother board shrinks more than the carrier substrate and the carrier substrate loosens, since the thermal expansion coefficient of the carrier substrate is lower than that of the mother board. As a result, stress on the solder-connected portions is reduced.

It is preferable in the chip carrier of this invention that the peripheral stiffener comprises metals that meet the above-mentioned requirement. In this preferable example, heat generated from the semiconductor chip can be emitted more efficiently when the chip carrier which is equipped with the semiconductor chip is packaged into an electronic device and operated.

It is also preferable that the peripheral stiffener is made in a zigzag form, so that heat generated from the semiconductor chip can be emitted more efficiently.

It is preferable that the carrier substrate is a resin multilayered substrate with inner via-holes where the open-ends of the via-holes are not exposed to the surface of the flexible insulating substrate, so that the bonding pads can be arrayed more freely compared to the case of a flexible substrate with through-holes.

It is preferable in the chip carrier that the first bonding pads and the second bonding pads are formed in patterns different from each other, so that the second pads can be located freely according to the circuit pattern on the mother printed circuit board. Thus, a high-density circuit can be easily provided.

It is also preferable that balls are provided at the surface of the second bonding pad, so that soldering is conducted easily. The balls are, for instance, solder balls for electric bonding.

A semiconductor device of this invention comprises a carrier substrate, a peripheral stiffener provided to the periphery of the carrier substrate, and a semiconductor chip mounted on the recess formed by the carrier substrate and the peripheral stiffener. The peripheral stiffener is made of a material having a thermal expansion coefficient higher than that of the carrier substrate. The carrier substrate comprising a flexible insulating substrate containing aramid fiber as a reinforcer, first bonding pads formed on one face of the flexible insulating substrate and second bonding pads formed on the other face of the flexible insulating substrate. The first bonding pads and the second bonding pads are electrically bonded with each other by via-holes punched in the flexible insulating substrate. Since the thermal expansion coefficient of the peripheral stiffener is higher than that of the carrier substrate, the carrier substrate is maintained to be flat due to tensile stress even if the semiconductor device is packaged into the mother board at high temperatures. As a result, the chip carrier will not warp, and the semiconductor device will be effectively prevented from rupture or disconnection caused by the difference of the thermal expansion coefficients.

It is preferable in the semiconductor device that the peripheral stiffener is formed with metals that meet the above-mentioned requirement. In the preferable example, heat generated from the semiconductor chip can be emitted more efficiently when the chip carrier equipped with the semiconductor chip is packaged into an electronic device and operated. It is also preferable that the peripheral stiffener is made in a zigzag form, so that heat generated from the semiconductor chip can be emitted more efficiently. It is preferable that the carrier substrate is a resin multilayered substrate with inner via-holes where the open-ends of the via-holes are not exposed to the surface of the flexible insulating board, so that the bonding pads can be arrayed more freely compared to the case of a flexible board with through-holes. It is preferable that the first bonding pads and the second bonding pads are formed in patterns different from each other, so that the second pads can be located freely according to the circuit pattern on the mother printed circuit board, and thus, a high-density circuit can be easily provided. It is also preferable that balls are provided to the surface of the second bonding pad, so that soldering is conducted easily. The balls are, for instance, solder balls for electric bonding.

It is preferable in the semiconductor device that the peripheral stiffener is thinner than the semiconductor chip, so that the thickness of the semiconductor device can be adjusted according to the thickness of the semiconductor chip without being limited by the thickness of the peripheral stiffener.

It is preferable in the semiconductor of the invention that the semiconductor chip is flip-chip packaged, so that the distance between the element in the semiconductor chip to the package bonding pads (the second bonding pads) becomes the shortest. As a result, its capacitance and inductance can be reduced compared to those of the conventional techniques, and the electrical property can be improved.

It is preferable in the semiconductor device that the semiconductor chip has area array terminal electrodes, so that the electrical property can be improved.

It is preferable in the semiconductor device that a finned heat sink is provided at the upper face of the semiconductor chip. It is further preferable that a finned heat sink is provided covering the upper face of the semiconductor chip and the periphery of the chip carrier. In this preferable embodiment, the heat generated during the operation of the semiconductor device is effectively emitted and the reliability of the semiconductor device and of the electrical equipment is improved.

BRIEF DESCRIPTION OF THE DRAWINGS

FIG. 6 is a cross-sectional view showing a third example of a semiconductor device.

FIG. 7 is a schematic view showing the peripheral stiffener used in the third example.

FIG. 8 is a cross-sectional view showing a fourth example of a semiconductor device.

FIG. 9 is a cross-sectional view showing a fifth example of a semiconductor device.

DESCRIPTION OF THE PREFERRED EMBODIMENTS

The embodiments of this invention are explained below, referring to drawings and examples.

Figure 1:
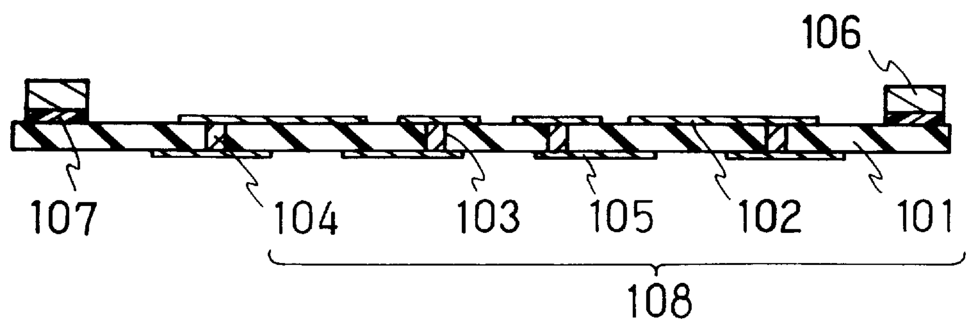
FIG. 1 is a cross-sectional view showing a carrier chip of an embodiment of this invention.
Figure 2:
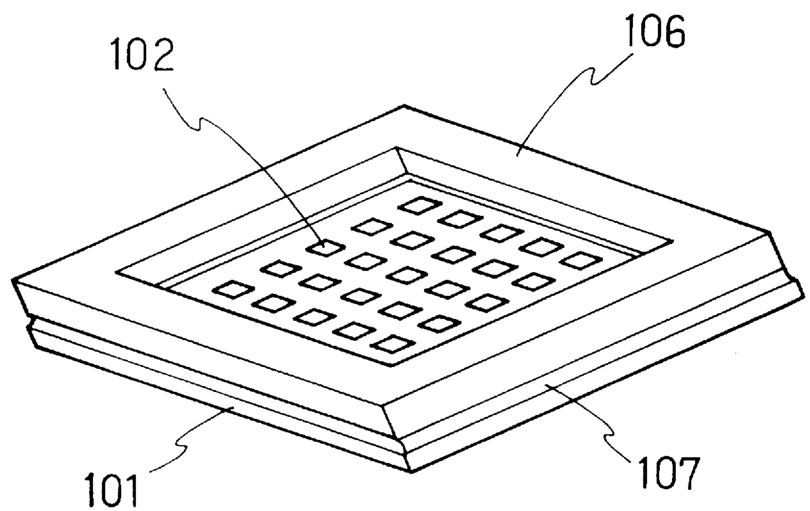
FIG. 2 is a perspective view showing the chip carrier of the embodiment of this invention.

FIGS. 1 and 2 are cross-sectional and perspective views showing a chip carrier of an embodiment of this invention. In FIGS. 1 and 2, the chip carrier comprises a carrier substrate 108 and a peripheral stiffener 106. The carrier substrate 108 comprises a flexible insulating board 101 reinforced by aramid fiber, first bonding pads 102 formed on one face of the flexible insulating board 101 and second bonding pads 105 formed on the other face of the board 101, and via-holes 103 in which conductors 104 are embedded.

An example of such a flexible insulating board 101 containing aramid fiber as a reinforcer is a woven or non-woven cloth of aramid fiber in which epoxy resin is impregnated. The first bonding pads 102 and the second bonding pads 105 are, for instance, copper films. The first bonding pads 102 and the second bonding pads 105 are electrically bonded with each other by the conductors 104 embedded in the via-holes 103. The conductors 104 are prepared by mixing epoxy resin with copper powder.

This carrier substrate 108 is known as a resin multilayered substrate with inner via-holes. One example is ALIVH (registered trademark) manufactured by Matsushita Electric Industrial Ltd. (see DENSHIZAIRYOU (Electronic Parts and Materials) 1995, October p.50–58).

A peripheral stiffener 106 is adhered to the periphery of the carrier substrate 108 with an adhesive 107. The stiffener 106 is formed with hollow-rectangular shape glass epoxy (a complex of glass fiber as reinforcer and impregnated epoxy resin). It is rather preferable that the carrier substrate 108 and the peripheral stiffener 106 are adhered to each other not so firmly. Commercial two-sided adhesive tapes, silicon-based or epoxy-based flexible adhesives can be used for the adhesion.

The array of the first bonding pads 102 corresponds to that of the terminal electrodes of the semiconductor chip mounted on this carrier substrate 108 and to the bonding method. When the terminal electrodes of the semiconductor chip are arrayed peripherally and it is a flip-chip packaging, the first bonding pads 102 are arrayed reverse to the terminal electrodes of the semiconductor carrier chip. When terminal electrodes of the semiconductor chip are distributed over the entire chip surface, which is called an area pad type or an area array type, they are also reversely arrayed. When the semiconductor chip and the carrier substrate 108 are bonded by a wire bond, the first bonding pads 102 are arrayed surrounding the periphery of the semiconductor chip.

In this embodiment, the peripheral stiffener 106 comprises glass epoxy, and its thermal expansion coefficient is 15 ppm/°C. The carrier substrate 108 is a complex of copper films, aramid fiber and resin, and its thermal expansion coefficient depends on the proportion of the surface covered by the copper film to the whole surface. In this embodiment, it is 6 to 10 ppm/°C. In other words, the peripheral stiffener 106 is designed to have a thermal expansion coefficient higher than that of the carrier substrate 108. The thermal expansion coefficient of the peripheral stiffener 106 is preferably higher than that of the carrier substrate 108 by 3–20 ppm/°C., more preferably, by 5–10 ppm/°C. In this embodiment, the carrier substrate 108 is under the influence of tensile strength when the semiconductor chip is mounted on the chip carrier and adhered by using resin at high temperatures. As a result, the carrier substrate is maintained in a flat condition without deformation, and thus, manufacturing yield is improved.

As mentioned above, the semiconductor device comprising a chip carrier and a semiconductor chip is maintained in a flat condition by the peripheral stiffener 106, so that the flat surface can be kept when this semiconductor device is packaged into the mother board. Therefore, packaging can be carried out easily and bonding reliability will be improved. The bonding reliability will still be high even after the semiconductor device is solder-packaged into the glass epoxy mother board. The carrier substrate and the mother board are solder-connected to each other at high temperatures up to 200° C., and both of them begin to shrink during chilling. The carrier substrate, however, becomes loose due to its lower thermal expansion coefficient, and stress will not be kept as the carrier substrate is flexible. This relationship can be kept even if the temperature is lower than room temperature.

A semiconductor device comprising a carrier substrate made of polyimide tape etc. has a thermal expansion coefficient much higher than that of the glass epoxy (30 to 40 ppm/°C.), so that the tensile strength will be great when chilling. The stress is further increased at lower temperatures, and as a result, the joints will be ruptured because of heating cycles.

The carrier substrate shown in FIG. 1 can be produced individually, or can be produced as a tape for the purpose of mass-production. The materials of the peripheral stiffener can be selected from various types, such as metals, ceramics, and resins. Though the carrier substrate in FIG. 1 is a two-sided dual substrate, this does not limit this invention, namely, multilayered substrates are also applicable.

Figure 3:
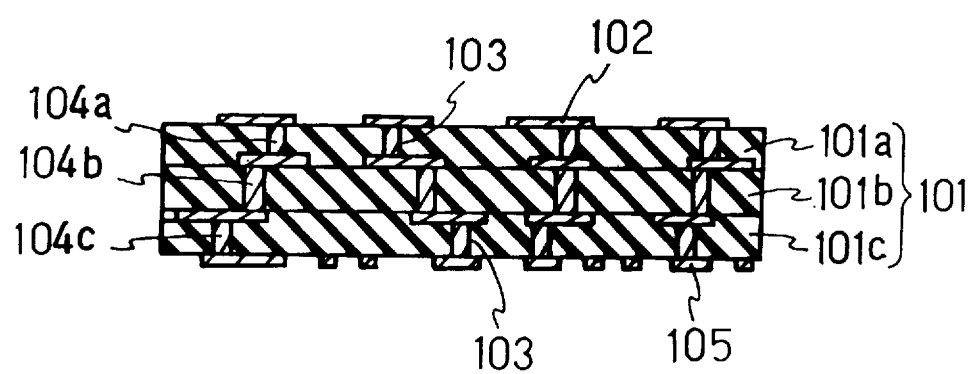
FIG. 3 is a cross-sectional view showing a resin multilayered substrate with inner via-holes, which is used for a carrier substrate of a chip carrier in the embodiment of this invention.

FIG. 3 is a magnified cross-sectional view showing a resin multilayered substrate with inner via-holes. As shown in FIG. 3, the first bonding pads 102 and the second bonding pads 105 are bonded with each other through via-holes 103 formed in insulating substrates (101*a*, 101*b*, and 101*c*) composing each layer. The via-holes are filled with conductors (104*a*, 104*b*, and 104*c*) made of conductive paste etc. The first bonding pads 102 are provided at the outermost surface, so the open ends of the via-holes 103 are not exposed. In this embodiment, the first bonding pads 102 on the resin multilayered substrate with inner via-holes (carrier substrate 108) are formed corresponding to the terminal electrode pattern of the LSI chip which is mounted on the surface. The pattern of the second bonding pads 105 can be varied through the wiring patterns of the inner layers of the multilayered substrate with inner via-holes, in order to correspond to the wiring pattern of the mother printed circuit board.

When the above-mentioned multilayered substrate with inner via-holes is used for the carrier substrate 108, influence of electromagnetic radiation, noise etc. can be prevented by providing a ground and power source layer to the inner layer wiring section. Connection with finer pitch is realized by use of a resin multilayered substrate with inner via-holes, and thus, smaller semiconductor devices can be produced.

This invention is not limited to the above-mentioned embodiment where a dual layered substrate and a multilayered substrate with inner via-holes are used for carrier substrates, but an ordinary multilayered substrate with through-holes can also be used.

As mentioned above, it is important to use aramid fiber as a reinforcer for the preparation of a carrier substrate. Though some other materials can maintain the relationship of thermal expansion coefficient, a carrier substrate containing aramid fiber as a reinforcer is the best for the substrate material because the absolute value of its thermal expansion coefficient is similar to that of the semiconductor chip (silicon). It is also clear from the above explanation that this structure provides a better result than a carrier substrate with a polyimide film.

In this embodiment, it is also possible to provide balls at the surfaces of the second bonding pads of the carrier substrate in order to be opposite to the mother board when packaging, like the cases of BGA, TBGA, or PBGA. This structure results in easy soldering. Though solder balls are generally used, recently copper balls are also used.

The following is an explanation on a semiconductor device using a chip carrier of this invention of this invention.

Figure 4:
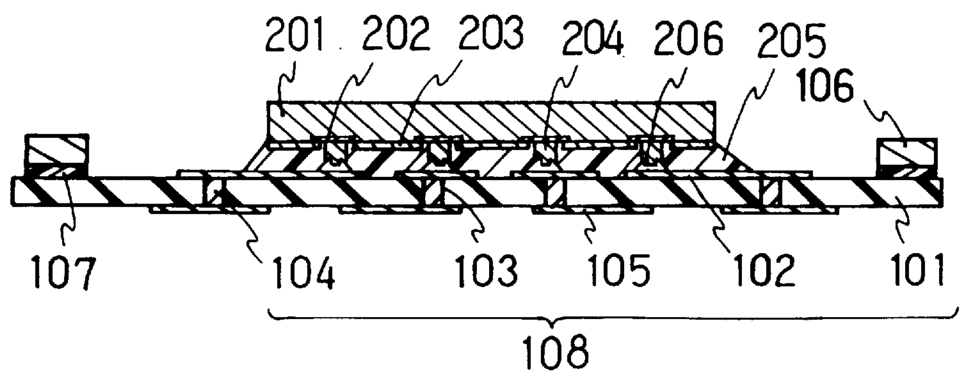
FIG. 4 is a cross-sectional view showing a first example of a semiconductor device.

FIG. 4 shows a semiconductor device in the first example, in which the chip carrier of the embodiment is used. In the first example, a two-sided substrate with inner via-holes (ALIVH) comprising aramid non-woven fiber and epoxy resin is used as the flexible insulating substrate 101 composing the carrier substrate 108. The first bonding pads 105 are copper films and the surface is Au/Ni plated.

As shown in FIG. 4, the semiconductor device of the first example is prepared by mounting an LSI chip 201 on the hollow-rectangular recess defined by the peripheral stiffener 106 of the chip carrier shown in FIG. 1. A protection film 203 is formed on the LSI chip carrier 201, and terminal electrodes 202 (aluminum thin films) are formed at the windows provided in this protection film. Gold bumps 204 are formed on the terminal electrodes 202 by using a wire bond device. The LSI chip was turned downward to correspond the positions of the terminal electrodes with the first bonding pads on the carrier substrate, and then, mounted on the carrier substrate, sandwiching conductive adhesive 206. After the conductive adhesive was cured at 120° C., sealing agent 205 was poured into the gap between the carrier substrate and the semiconductor chip and cured at 150° C. The carrier substrate is still flat during this process, and troubles like deformation will not occur while mounting the LSI chip. This process for packaging a semiconductor chip is generally known as stud bump flip-chip packaging.

The electrical properties of this invention are remarkably improved if a semiconductor chip having area array type terminal electrodes is packaged by using this flip-chip packaging, since the distance between the elements inside the semiconductor chip and the bonding pads of the package (the second bonding pads) is shortened, and as a result, capacitance and inductance can be reduced compared to those of the conventional techniques. Therefore, this method provides the best packaging for the semiconductor chip to deal with high speed signals.

In the first example, a thin substrate of about 0.1 mm can be used for the carrier substrate 108, so the whole thickness of the semiconductor device can be controlled to be 0.6 mm or less. It is preferable that the peripheral stiffener is made thinner than the semiconductor chip, so that the peripheral stiffener will not limit the thickness. The backside of the semiconductor chip (LSI chip) of a semiconductor device of this invention is exposed, so that heat is easily emitted. The finned heat sink can be directly attached. In this structure, molding is not necessary and extra strain does not occur, since the backside of the LSI chip can be left bare. Therefore, its reliability is improved.

This invention is not limited to the flip-chip packaging. Another packaging method is that the LSI chip is turned forward and mounted on the carrier substrate, and the terminal electrodes on the LSI chip and the first bonding pads on the carrier substrate are bonded by wire bond. In this method, the surfaces of the LSI chip and of the carrier substrate should be molded.

Figure 5:
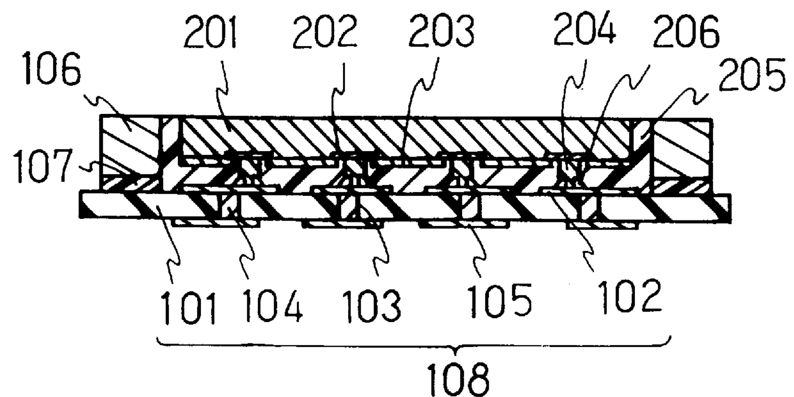
FIG. 5 is a cross-sectional view showing a second example of a semiconductor device.

FIG. 5 shows a semiconductor device of the second example, in which the chip carrier of the embodiment of this invention is used. The second example aims to miniaturize the semiconductor device by providing a peripheral stiffener 106 around the semiconductor chip 201. In this case, the sealing agent 205 is also filled in the gap between the semiconductor device 201 and the peripheral stiffener 107.

FIG. 6 shows the semiconductor device of the third example, in which the chip carrier of the embodiment of this invention is used. In the third example, the peripheral stiffener 106 of the semiconductor device of the second example is made of a metal with good heat conductance in order to improve the heat emission property. The third example shown in FIG. 6 is similar to the second example shown in FIG. 5, except for the materials and shape of the peripheral stiffener 106. The material is preferably selected from metals. Though metals with good heat conductance, such as aluminum and copper are preferred, other metals can also be used. Shapes to stimulate heat emission are preferred. In the third example, the peripheral stiffener is made in a zigzag form to increase the surface area in order to accelerate heat emission, as shown in FIG. 7. For example, as seen in FIG. 7, the form of the peripheral stiffener can be a compact, sinusoidal-type configuration. This metallic zigzag peripheral stiffener 106 controls tensile strength applied to the carrier substrate. The tensile strength is caused by the difference of thermal expansion coefficients between the carrier substrate 108 and the peripheral stiffener 106.

FIG. 8 shows the semiconductor device of the fourth example, in which the chip carrier of the embodiment of this invention is used. In the fourth example, a finned heat sink 601 (aluminum etc.) with excellent heat conductance is attached to the surface of the LSI chip explained in the first example by using an adhesive 602 having good heat conductance. In this manner, heat can be easily emitted even if a semiconductor chip which generates much heat is used. The emission property is specifically good since the finned heat sink is directly attached to the backside of the semiconductor chip.

FIG. 9 shows a semiconductor device of the fifth example, in which a chip carrier of the embodiment of this invention is used. In this fifth example, a finned heat sink 601 (aluminum etc.) with excellent heat conductance is attached to the surface of the LSI chip explained in the second and third examples by using an adhesive 602 having good heat conductance. In this manner too, heat can be easily emitted even if a semiconductor chip which generates much heat is used. Similar to the above example, the emission property is especially good since the finned heat sink is directly attached to the backside of the semiconductor chip.

Figure 10:
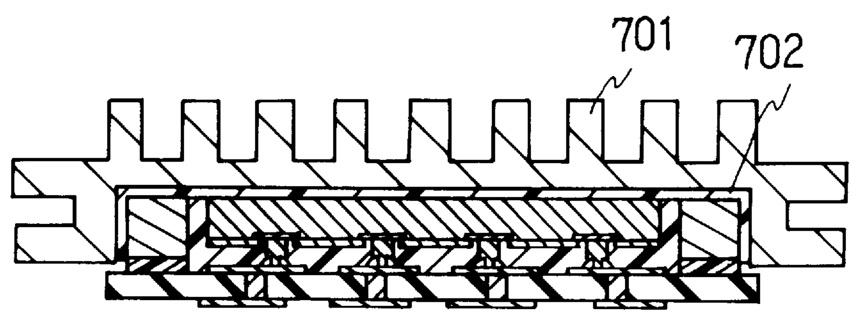
FIG. 10 is a cross-sectional view showing a sixth example of a semiconductor device.

FIG. 10 shows a semiconductor device of the sixth example, in which a chip carrier of the embodiment of this invention is used. In this sixth example, a finned heat sink 701 is provided to the peripheral stiffener 106 by an adhesive 702. While the finned heat sink 601 of the fifth example is provided only at the upper surface of the LSI chip 201 comprising the semiconductor device, the finned heat sink (a coronary heat sink) 701 is provided not only at the upper surface of the LSI chip but also at the periphery of the peripheral stiffener 106 so that the finned heat sink 701 surrounds the peripheral stiffener. In this manner, heat can be efficiently emitted even if a more powerful semiconductor device is packaged.

Although bonding between the semiconductor chips and the carrier substrates in the above examples are mainly carried out by the stud bump flip-chip packaging, this invention is not limited to these; other methods such as a bonding method using solder balls (C4 method) are also available.

Though one semiconductor chip is used for each example in this invention, this invention is not limited to this; plural semiconductor chips can be packaged to be a multichip module (MCM).

It is also possible to prepare a composite MCM by mounting a QFP which is used for not only a bare semiconductor chip but also for a packaged semiconductor chip, i.e. surface mount technology (SMT). It is further possible to mount passive parts such as a capacitor and a resistor.

As mentioned above, this invention provides a chip carrier whose carrier substrate does not warp or have any other deformation even if the semiconductor is kept at high temperatures during the manufacturing process. As a result, the manufacturing yield is improved. In addition, a semiconductor device comprising the chip carrier has excellent reliability in bonding between the LSI chip and the carrier substrate, and a highly reliable bonding can be obtained when the semiconductor device is packaged into a mother board.

What is claimed is:

1. A chip carrier comprising a carrier substrate and a peripheral stiffener provided at the periphery of said carrier substrate, said carrier substrate comprising:

a flexible insulating substrate containing aramid fiber as a reinforcer, first bonding pads formed on one face of said flexible insulating substrate, and second bonding pads formed on the other face of said flexible insulating substrate, said first bonding pads and said second bonding pads being electrically bonded to each other by via-holes punched in said flexible insulating substrate, wherein said peripheral stiffener is made of a material whose thermal expansion coefficient is sufficiently higher than that of said carrier substrate to resist warping of the carrier substrate due to temperature fluctuations.

2. The chip carrier according to claim 1, wherein said peripheral stiffener is a metal.

3. The chip carrier according to claim 1, wherein said peripheral stiffener is formed in a zigzag pattern.

4. The chip carrier according to claim 1, wherein said carrier substrate is a resin multilayered substrate with inner via-holes, and the open ends of said via-holes are prevented from being exposed to the surface of said flexible insulating substrate.

5. The chip carrier according to claim 1, wherein said first bonding pads and said second bonding pads are formed with patterns different from each other.

6. The chip carrier according to claim 1, wherein balls are provided at the upper surface of said the second bonding pads.

7. A semiconductor device comprising a carrier substrate, a peripheral stiffener provided at the periphery of said carrier substrate, and a semiconductor chip mounted in a recess defined by said carrier substrate and said peripheral stiffener, where said carrier substrate comprises:

a flexible insulating substrate containing aramid fiber as a reinforcer, first bonding pads formed on one face of said flexible insulating substrate, and second bonding pads formed on the other face of said flexible insulating substrate, said first bonding pads and said second bonding pads being electrically bonded to each other by via-holes punched in said flexible insulating substrate, wherein said peripheral stiffener is made of materials whose thermal expansion coefficient is sufficiently higher than that of said carrier substrate to resist warping of the carrier substrate due to temperature fluctuations.

8. The semiconductor device according to claim 7, wherein said peripheral stiffener is a metal.

9. The semiconductor device according to claim 7, wherein said peripheral stiffener is formed in a zigzag pattern.

10. The semiconductor device according to claim 7, wherein said carrier substrate is a resin multilayered substrate with inner via-holes, and the open ends of said via-holes are prevented from being exposed to the surface of said flexible insulating substrate.

11. The semiconductor device according to claim 7, wherein said first bonding pads and said second bonding pads are formed with patterns different from each other.

12. The semiconductor device according to claim 7, wherein balls are provided at the upper surface of said the second bonding pads.

13. The semiconductor device according to claim 7, wherein said peripheral stiffener is thinner than said semiconductor chip.

14. The semiconductor device according to claim 7, wherein said semiconductor chip is flip-chip packaged.

15. The semiconductor device according to claim 14, wherein said semiconductor chip has area array type terminal electrodes.

16. The semiconductor device according to claim 7, wherein a finned heat sink is provided at an upper surface of said semiconductor chip.

17. The semiconductor device according to claim 7, wherein a finned heat sink is provided in order to cover an upper surface of said semiconductor chip and to cover the periphery of said chip carrier.

18. The semiconductor device of claim 7, wherein said thermal expansion coefficient of said peripheral stiffener is higher than that of said carrier substrate by 3–20 ppm/°C.

19. The chip carrier of claim 1, wherein said thermal expansion coefficient of said peripheral stiffener is higher than that of said carrier substrate by 3–20 ppm/°C.

* * * * *